(12) United States Patent
Kronmueller et al.

(10) Patent No.: US 9,575,500 B2
(45) Date of Patent: Feb. 21, 2017

(54) SINK/SOURCE OUTPUT STAGE WITH OPERATING POINT CURRENT CONTROL CIRCUIT FOR FAST TRANSIENT LOADING

(71) Applicant: Dialog Semiconductor (UK) Limited, Reading (GB)

(72) Inventors: Frank Kronmueller, Neudenau (DE); Ambreesh Bhattad, Swindon (GB)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/838,245

(22) Filed: Aug. 27, 2015

(65) Prior Publication Data
US 2016/0179115 A1    Jun. 23, 2016

(30) Foreign Application Priority Data
Dec. 17, 2014    (DE) .......................... 10 2014 226 168

(51) Int. Cl.
*G05F 1/575* (2006.01)
*H03F 3/45* (2006.01)

(52) U.S. Cl.
CPC .......... *G05F 1/575* (2013.01); *H03F 3/45183* (2013.01); *H03F 2203/45112* (2013.01); *H03F 2203/45166* (2013.01); *H03F 2203/45674* (2013.01)

(58) Field of Classification Search
CPC ...................................................... G05F 1/575
See application file for complete search history.

(56) References Cited

U.S. PATENT DOCUMENTS 3,619,798 A * 11/1971 Smith ..................... G05F 1/561
                                                                330/295
4,004,247 A *  1/1977 Van de Plassche .... G01R 15/08
                                                                323/315
(Continued)

FOREIGN PATENT DOCUMENTS

EP        2 520 998        11/2012

OTHER PUBLICATIONS

German Search Report and translation 10 2014 226 168.6, May 20, 2015, Dialog Semiconductor (UK) Limited.
(Continued)

*Primary Examiner* — Timothy J Dole
*Assistant Examiner* — Yusef Ahmed
(74) *Attorney, Agent, or Firm* — Saile Ackerman LLC; Stephen B. Ackerman

(57) ABSTRACT

A voltage regulator is described. It includes an amplification stage to control a voltage level of a first gain node and of a second gain node in response to an input voltage, to activate a first and a second output stage, respectively. It further includes the first output stage to source a current at an output node of the voltage regulator from a first potential. The voltage regulator includes the second output stage to sink a current at the output node to a second potential. The voltage regulator includes a first operating point control circuit to set the voltage level of the first gain node such that a first maintenance current is sourced by the first output stage; and/or a second operating point control circuit to set the voltage level of the second gain node such that a second maintenance current is sunk by the second output stage.

24 Claims, 7 Drawing Sheets

(56) References Cited

U.S. PATENT DOCUMENTS

| | | | | |
|---|---|---|---|---|
| 4,570,128 | A * | 2/1986 | Monticelli | H03F 3/3067 330/264 |
| 4,584,520 | A * | 4/1986 | Vinn | G05F 3/22 323/316 |
| 4,672,326 | A * | 6/1987 | Cini | H03G 11/04 327/318 |
| 5,497,074 | A * | 3/1996 | Boezen | H03F 3/45479 323/316 |
| 5,804,958 | A * | 9/1998 | Tsui | G05F 3/262 323/313 |
| 6,346,804 | B2 * | 2/2002 | Ueno | 323/280 |
| 6,545,502 | B1 * | 4/2003 | Dasgupta | H03F 3/45089 326/21 |
| 6,642,778 | B2 * | 11/2003 | Opris | G05F 3/30 323/312 |
| 2002/0190793 | A1 * | 12/2002 | Moon | H03F 3/3023 330/253 |
| 2004/0217812 | A1 * | 11/2004 | Jaussi | H03F 1/486 330/253 |
| 2005/0001605 | A1 * | 1/2005 | Marinca | G05F 3/30 323/314 |
| 2005/0030097 | A1 * | 2/2005 | Ivanov | H03F 3/21 330/264 |
| 2005/0083112 | A1 * | 4/2005 | Shor | G05F 3/262 327/541 |
| 2006/0066390 | A1 * | 3/2006 | Shi | G06G 7/20 327/538 |
| 2009/0108934 | A1 * | 4/2009 | Forejt | H03F 3/45183 330/253 |
| 2009/0322429 | A1 * | 12/2009 | Ivanov | H03F 3/45179 330/257 |
| 2010/0164457 | A1 * | 7/2010 | Al-Shyoukh | H03F 3/2173 323/284 |
| 2010/0289465 | A1 * | 11/2010 | Elran | G05F 1/575 323/281 |
| 2013/0314063 | A1 * | 11/2013 | Napravnik | G05F 1/56 323/273 |
| 2014/0084994 | A1 * | 3/2014 | Merkin | G05F 1/56 327/543 |
| 2014/0218112 | A1 * | 8/2014 | Brantley | H03F 3/45192 330/254 |
| 2014/0375289 | A1 * | 12/2014 | Kronmueller | G05F 1/565 323/280 |
| 2015/0015331 | A1 * | 1/2015 | Kronmueller | H03F 3/45179 330/254 |
| 2015/0015332 | A1 * | 1/2015 | Kronmueller | H03F 1/342 330/254 |

OTHER PUBLICATIONS

German Office Action, File No. 10 2014 226 168.6, Applicant: Dialof Semiconductor (UK) Limited, Mail date: Aug. 11, 2016, 5 pgs, and English language translation, 11 pgs.

* cited by examiner

SINK/SOURCE OUTPUT STAGE WITH OPERATING POINT CURRENT CONTROL CIRCUIT FOR FAST TRANSIENT LOADING

TECHNICAL FIELD

The present document relates to multi-stage amplifiers, such as linear regulators or linear voltage regulators (e.g. low-dropout regulators), configured to provide a constant output voltage subject to load transients.

BACKGROUND

Example multi-stage amplifiers are low-dropout (LDO) regulators which are linear voltage regulators which can operate with small input-output differential voltages. A typical LDO regulator 100 is illustrated in FIG. 1a. The LDO regulator 100 comprises an output amplification stage 103, e.g. a field-effect transistor (FET), at the output and a differential amplification stage or differential amplifier 101 (also referred to as error amplifier) at the input. A first input (fb) 107 of the differential amplifier 101 receives a fraction of the output voltage $V_{out}$ determined by the voltage divider 104 comprising resistors R0 and R1. The second input (ref) to the differential amplifier 101 is a stable voltage reference $V_{ref}$ 108 (also referred to as the bandgap reference). If the output voltage $V_{out}$ changes relative to the reference voltage $V_{ref}$, the drive voltage to the output amplification stage, e.g. the power FET, changes by a feedback mechanism called main feedback loop to maintain a constant output voltage $V_{out}$.

The LDO regulator 100 of FIG. 1a further comprises an additional intermediate amplification stage 102 configured to amplify the output voltage of the differential amplification stage 101. As such, an intermediate amplification stage 102 may be used to provide an additional gain within the amplification path. Furthermore, the intermediate amplification stage 102 may provide a phase inversion.

In addition, the LDO regulator 100 may comprise an output capacitance $C_{out}$ (also referred to as output capacitor or stabilization capacitor or bypass capacitor) 105 parallel to the load 106. The output capacitor 105 is used to stabilize the output voltage $V_{out}$ subject to a change of the load 106, in particular subject to a change of the load current $I_{load}$. It should be noted that typically the output current $I_{out}$ at the output of the output amplification stage 103 corresponds to the load current $I_{load}$ through the load 106 of the regulator 100 (apart from typically minor currents through the voltage divider 104 and the output capacitance 105). Consequently, the terms output current $I_{out}$ and load current $I_{load}$ are used synonymously, if not specified otherwise.

Typically, it is desirable to provide a stable output voltage $V_{out}$, even subject to (positive or negative) transients of the load 106. By way of example, the regulator 100 may be used to provide a stable output voltage $V_{out}$ to the processor of an electronic device (such as a smartphone). The load current $I_{load}$ may vary significantly between a sleep state and an active state of the processor, thereby varying the load 106 of the regulator 100. In order to ensure a reliable operation of the processor, the output voltage $V_{out}$ should remain stable, even in response to such load transients. In particular, overvoltage and/or undervoltage situations of the output voltage $V_{out}$ should be avoided.

At the same time, the LDO regulator 100 should be able to react rapidly to load transients, i.e. the LDO regulator 100 should be able to rapidly provide the requested load current $I_{load}$, subject to a load transient. This means that the LDO regulator 100 should exhibit a high bandwidth.

The regulator 100 shown in FIG. 1a is an example of a multi-stage amplifier or voltage regulator.

SUMMARY

The present document is directed at providing power efficient multi-stage amplifiers or voltage regulators which exhibit a high response speed, subject to positive and negative load transients. According to an aspect, a voltage regulator, such as a linear regulator, is described. The voltage regulator may comprise a plurality of amplification stages. In particular, the voltage regulator comprises an amplification stage which may be configured to activate or to deactivate a first output stage of the voltage regulator in response to an input voltage at an input node. Furthermore, the amplification stage may be configured to activate or to deactivate a second output stage in response to the input voltage at the input node. In particular, the amplification stage may be configured to control a voltage level of a first gain node and of a second gain node in response to the input voltage at the input node, in order to activate the first and the second output stage, respectively. The second gain node is typically different from the first gain node.

The amplification stage may also be referred to as an intermediate amplification stage, because the voltage regulator typically comprises one or more additional amplification stages (e.g. a differential amplification stage) upstream of the input node, i.e. upstream of the amplification stage. The input mode may correspond to an output of the one or more additional amplification stages upstream of the input node.

The voltage regulator comprises the first output stage which is configured to source a current at an output node of the voltage regulator from a first or high potential (e.g. from a supply voltage), when the first output stage is activated. In addition, the voltage regulator comprises the second output stage which is configured to sink a current at the output node of the voltage regulator to a second or low potential (e.g. to ground), when the second output stage is activated. The first potential is different from the second potential.

The amplification stage may be configured to activate the first output stage and the second output stage in a mutually exclusive manner. In particular, the amplification stage may ensure that (apart from a maintenance current within the first and/or the second output stages) either the first output stage is active to source a current to the output node, or the second output stage is active to sink a current to the output node. By doing this, the output voltage of the voltage regulator at the output node may be stabilized, subject to load transients, in a fast and in an energy efficient manner.

In particular, the amplification stage may be configured to activate the first output stage, if the input voltage is at or below a pre-determined first threshold voltage. An input voltage which is at or below the pre-determined first threshold voltage may be an indication for an undervoltage situation of the output voltage at the output node. Furthermore, the amplification stage may be configured to activate the second output stage, if the input voltage is at or above a pre-determined second threshold voltage. An input voltage which is at or above the pre-determined second threshold voltage may be an indication for an overvoltage situation of the output voltage at the output node. The second threshold voltage may be equal to or greater than the first threshold voltage. Hence, a current may be sourced at the output node to counter an undervoltage situation (subject to a positive load transient) and a current may be sunk at the output node to counter an overvoltage situation (subject to a negative load transient).

It should be noted that the term active may be understood as being operated to source or to sink a current which is equal to or greater than a pre-determined current threshold. The pre-determined current threshold may correspond to a maintenance current, which may be maintained within the first and/or the second output stage, in order to decrease the response time for the activation of the first and/or the second output stage. An output stage which only exhibits a maintenance current may be considered to be in a standby mode that allows for a fast activation of the respective output stage.

The amplification stage may comprise a first amplification stage current source which is configured to provide a first amplification stage current. Furthermore, the amplification stage may comprise an input transistor (e.g. an N-type metal oxide semiconductor, MOS, transistor) which is arranged in series with the first amplification stage current source. A gate of the input transistor may be (directly) coupled to the input node. Hence, a level of the drain-source current through the input transistor may be controlled by the input voltage at the input node. The amplification stage may be configured to control a voltage level at a midpoint between the first amplification stage current source and the input transistor, subject to the input voltage at the input node. This midpoint may correspond to the first gain node (which is identified herein by the letter A). The first output stage (notably the gate of a first control transistor of the first output stage) may be (directly) coupled to the first gain node. By controlling the voltage level at the first gain node, the first output stage may be activated or deactivated.

Furthermore, the amplification stage may comprise a second amplification stage current source which is configured to provide a second amplification stage current. Furthermore, the amplification stage may comprise a second transistor (e.g. an N-type MOS transistor) which is arranged in series with the second amplification stage current source. A gate of the second transistor may be controlled based on a feedback current through the first output stage. The feedback current through the first output stage may be sensed at an input (e.g. at the first control transistor) or at an output (e.g. at the first output transistor) of the first output stage.

The amplification stage may be configured to control a voltage level at a midpoint between the second amplification stage current source and the second transistor, based on the feedback current through the first output stage. The midpoint between the second amplification stage current source and the second transistor may correspond to the second gain node (which is referred to herein by the letter B). The second output stage (notably a gate of a second control transistor of the second output stage) may be (directly) coupled to the second gain node. By controlling the voltage level at the second gain node, the second output stage may be activated or deactivated.

The first amplification current source may be (directly) coupled to the first potential, a drain of the input transistor may be (directly) coupled to the first gain node, and a source of the input transistor may be (directly) coupled to the second potential. As such, the voltage level at the first gain node may vary between the first potential and the second potential (minus the threshold voltage of the input transistor), depending on the input voltage at the input node. A first gain node at the first potential may activate the first output stage and a first gain node at or close to the second potential may deactivate the first output stage.

The second amplification stage current source may be (directly) coupled to the first potential, a drain of the second transistor may be (directly) coupled to the second gain node and a source of the second transistor may be (directly) coupled to the first gain node. Consequently, the voltage level at the second gain node may vary between the first potential and the second potential (minus the threshold voltage of the input transistor and of the second transistor), depending on the input voltage at the input node. A second gain node at the first potential may deactivate the second output stage and a second gain node at (or close to) the second potential may activate the second output stage.

The first amplification stage current and the second amplification stage current may differ from one another. In particular, the second amplification stage current may be smaller than the first amplification stage current. Alternatively or in addition, the size of the input transistor may differ from the size of the second transistor. By changing the currents and/or the sizes, the input voltage (i.e. the first threshold voltage) at which the first gain node goes high (to active the first output stage) and the input voltage (i.e. the second threshold voltage) at which the second gain node goes low (to activate the second output stage) may be defined. By doing this, a dead band between sourcing of current and sinking of current may be defined.

The first output stage may comprise a first control transistor having a gate which is (directly) coupled to the first gain node, and being configured to vary a first control current through the first control transistor, subject to a voltage level at the gate of the first control transistor. In particular, the first control current may be increased if the voltage level at the first gain node is increased. Furthermore, the first output stage may comprise a first output amplifier which is configured to source an amplified version of the first control current to the output node. The first output amplifier may comprise a first current mirror with a first diode transistor and a first output transistor. The first diode transistor may be arranged in series with the first control transistor (e.g. such that the first diode transistor is traversed by the first control current). A drain of the first output transistor may be (directly) coupled to the output node, and the first output transistor may be traversed by the amplified version of the first control current, which is sourced at the output node.

In a similar and complementary manner, the second output stage may comprise a second control transistor having a gate which is (directly) coupled to the second gain node, and being configured to vary a second control current through the second control transistor, subject to a voltage level at the gate of the second control transistor. In particular, the second control current may increase if the voltage level at the second gain node decreases. Furthermore, the second output stage may comprise a second output amplifier which is configured to sink an amplified version of the second control current at the output node. The second output amplifier may comprise a second current mirror with a second diode transistor and a second output transistor. The second diode transistor may be arranged in series with the second control transistor (e.g. such that the second diode transistor is traversed by the second control current). A drain of the second output transistor may be (directly) coupled to the output node. Furthermore, the second output transistor may be traversed by the amplified version of the second control current, which is sunk at the output node.

The first output transistor and the second output transistor may be arranged in series between the first potential and the second potential. The output node may correspond to a midpoint between the (drain of the) first output transistor and the (drain of the) second output transistor. A source of the first output transistor may be coupled to the first potential, and a source of the second output transistor may be coupled to the second potential. As such, by activating the first output stage, a current may be drawn from the first potential through the first output transistor, in order to provide an increased load current to a load which may be coupled to the output node. In a similar manner, a current may be sunk to the second potential via the second output transistor, in order to sink a superfluous current from the output node. As a result of this, the output voltage at the output node may be stabilized in an efficient manner.

In symmetry to the first and second output transistors, a source of the first diode transistor may be (directly) coupled to the first potential, a source of the first control transistor may be (directly) coupled to the second potential, a source of the second diode transistor may be (directly) coupled to the second potential, and a source of the second control transistor may be (directly) coupled to the first potential.

As indicated above, the first and second output stages may be implemented in a complementary manner, notably with respect to the type of transistors used and/or with respect to the potential to which the stage refers. In particular, the first control transistor may comprise (or may be) an N-type MOS transistor, and the first output amplifier may comprise P-type MOS transistors. Consequently, the second control transistor may comprise (or may be) a P-type MOS transistor, and the second output amplifier may comprise N-type MOS transistors.

As outlined above, the first and/or the second output stages may be provided with a maintenance current, in order to maintain the output stages in a standby mode for speeding up the activation of the respective stage. The first output stage may be considered to be activated if the current which is sourced by the first output stage at the output node exceeds a pre-determined first maintenance current. If the current which is sourced at the output of the first output stage is at or below the first maintenance current, then the first output stage may be considered to be in a standby mode. In a similar manner, the second output stage may be considered to be activated if the current which is sunk by the second output stage at the output node exceeds a pre-determined second maintenance current. If the current which is sunk at the output of the second output stage is at or below the second maintenance current, then the second output stage may be considered to be in a standby mode.

The voltage regulator may comprise a first operating point control circuit which is configured to set the voltage level of the first gain node such that the first maintenance current is sourced by the first output stage, when the second output stage is activated. Alternatively or in addition, the voltage regulator may comprise a second operating point control circuit which is configured to set the voltage level of the second gain node such that the second maintenance current is sunk by the second output stage, when the first output stage is activated. Hence, the voltage regulator may exhibit an increased speed for reacting to load transients.

The first operating point control circuit may comprise a first reference current source which is configured to provide a first reference current. Furthermore, the first operating point control circuit may comprise a first reference transistor (e.g. an N-type MOS transistor) arranged in series with the first reference current source. The first reference current source may be (directly) coupled to the first potential, a drain of the first reference transistor may be (directly) coupled to the first reference current source and a source of the first reference transistor may be (directly) coupled to the second potential.

The first reference transistor may be controlled based on the feedback current through the first output stage. In particular, a voltage level at the gate of the first reference transistor may be dependent on the feedback current through the first output stage. The feedback current may correspond to a current sensed at the first control transistor of the first output stage and/or to a current sensed at an output of the first output amplifier of the first output stage.

In particular, the voltage regulator may comprise a first sense transistor (e.g. a P-type MOS transistor). A source of the first sense transistor may be coupled to a source of the first output transistor of the first output stage. A gate of the first sense transistor may be coupled to a gate of the first output transistor. The feedback current may be derived from the current at a drain of the first sense transistor (e.g. using a current mirror). In particular, the feedback current may be compared with the first reference current, in order to set the voltage level at the gate of the second transistor.

The midpoint between the first reference current source and the first reference transistor may be coupled to a gate of the second transistor. As such, the second transistor may be controlled based on the feedback current through the first output stage.

The voltage level at the midpoint between the first reference current source and the first reference transistor may be controlled using the first reference current. Furthermore, the state of the second transistor may be used to control the state of the first control transistor of the first output stage, thereby controlling a current which is sourced by the first output stage. Hence, the first maintenance current at the output of the first output stage may be dependent on the first reference current.

In a similar manner, the second operating point control circuit may comprise a second reference current source which is configured to provide a second reference current. Furthermore, the second operating point control circuit may comprise a second reference transistor which is arranged in series with the second reference current source. The second reference transistor may be controlled based on a feedback current through the second output stage. This feedback current may be sensed at the second control transistor of the second output stage and/or at the second output transistor of the second output stage.

A midpoint between the second reference current source and the second reference transistor may be coupled to a gate of a clamp transistor (e.g. a P-type transistor) which is configured to set the level of the second gain node (similar to the second transistor for the first operating point control circuit). Using similar mechanisms as the first operating point control circuit, the second maintenance current may be dependent on the second reference current.

As indicated above, the voltage regulator may comprise one or more further amplification stages. Furthermore, the voltage regulator may comprise a feedback loop for regulating the output voltage. In particular, the voltage regulator may comprise voltage sensing means (e.g. a voltage divider) which are configured to provide an indication of the output voltage at the output node. In addition, the voltage regulator may comprise a differential amplification stage which is configured to provide the input voltage at the input node, based on a reference voltage and based on the indication of the output voltage at the output node. By doing this, the output voltage may be regulated in accordance to the reference voltage.

According to a further aspect, a method for stabilizing an output voltage at an output node of a voltage regulator is described. The method may comprise activating or deactivating a first output stage of the voltage regulator, in response to an input voltage at an input node. The input voltage at the input node may be dependent on (or may be derived from) the output voltage at the output node. Furthermore, the method may comprise activating or deactivating a second output stage in response to the input voltage at the input node. The first output stage and the second output stage may be activated in a mutually exclusive manner. The method may comprise sourcing a current at the output node of the voltage regulator from a first potential, by activating the first output stage, if the input voltage at the input node is indicative of an undervoltage situation at the output node. In addition, the method may comprise sinking a current at the output node of the voltage regulator to a second potential, by activating the second output stage, if the input voltage at the input node is indicative of an overvoltage situation at the output node. In addition, the method may comprise controlling the first output stage such that a first maintenance current is sourced by the first output stage, when the second output stage is activated. Alternatively or in addition, the method may comprise controlling the second output stage such that a second maintenance current is sunk by the second output stage, when the first output stage is activated.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1A:
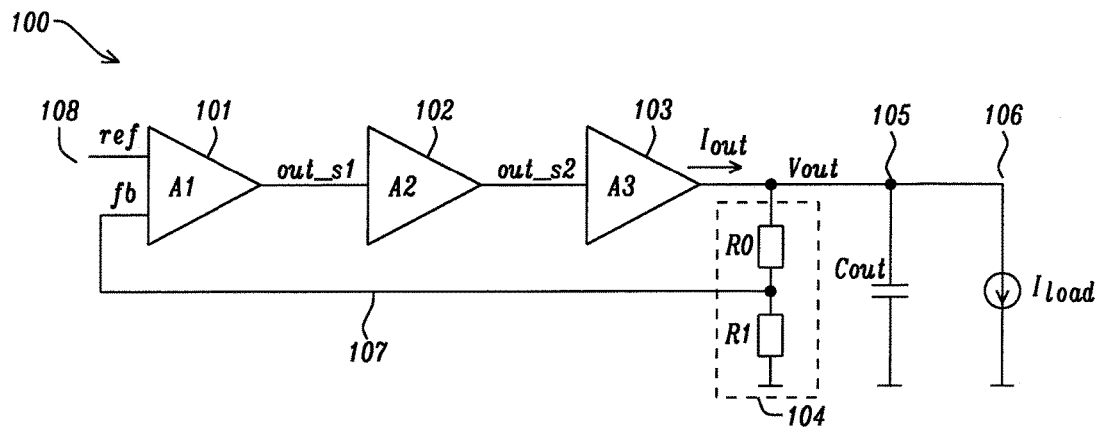
FIG. 1a illustrates an example block diagram of an LDO regulator.
Figure 1B:
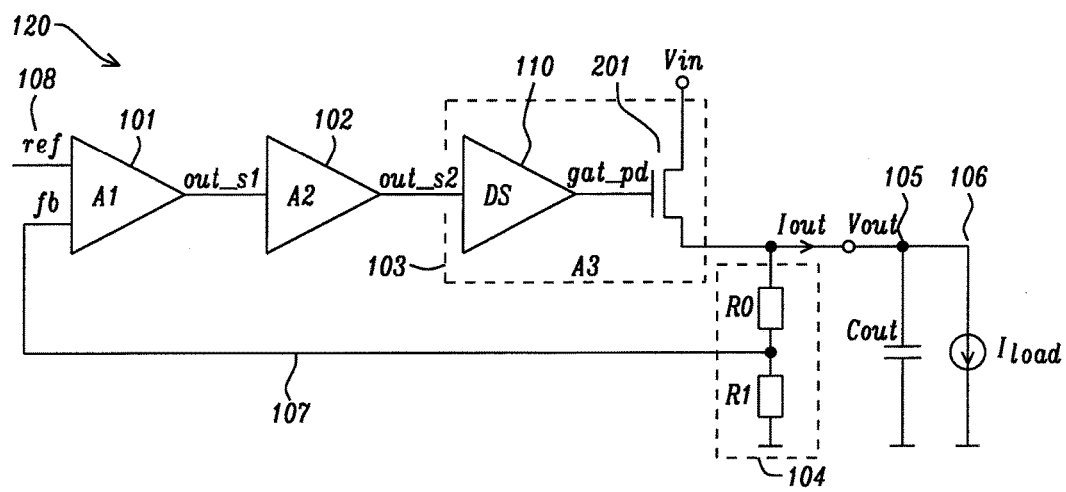
FIG. 1b illustrates the example block diagram of an LDO regulator in more detail.

As already outlined above, FIG. 1a shows an example block diagram for an LDO regulator 100 with its three amplification stages A1, A2, A3 (reference numerals 101, 102, 103, respectively). FIG. 1b illustrates the block diagram of a LDO regulator 120, wherein the output amplification stage A3 (reference numeral 103) is depicted in more detail. In particular, the pass transistor 201 and the driver stage 110 of the output amplification stage 103 are shown. Typical parameters of an LDO regulator are a supply voltage of 3V, an output voltage of 2V, and an output current or load current ranging from 1 mA to 100 or 200 mA. Other configurations are possible. The present invention is described in the context of a linear regulator. It should be noted, however, that the present invention is applicable to multi-state amplifiers in general.

It is desirable to provide a multi-stage amplifier such as the regulator 100, 120, which is configured to generate a stable output voltage $V_{out}$ subject to load transients. The output capacitor 105 may be used to stabilize the output voltage $V_{out}$, because in case of a load transient, an additional load current $I_{load}$ may be provided by or may be sunk by the output capacitor 105. Furthermore, schemes such as Miller compensation and/or load current dependent compensation may be used to stabilize the output voltage $V_{out}$.

Figure 2:
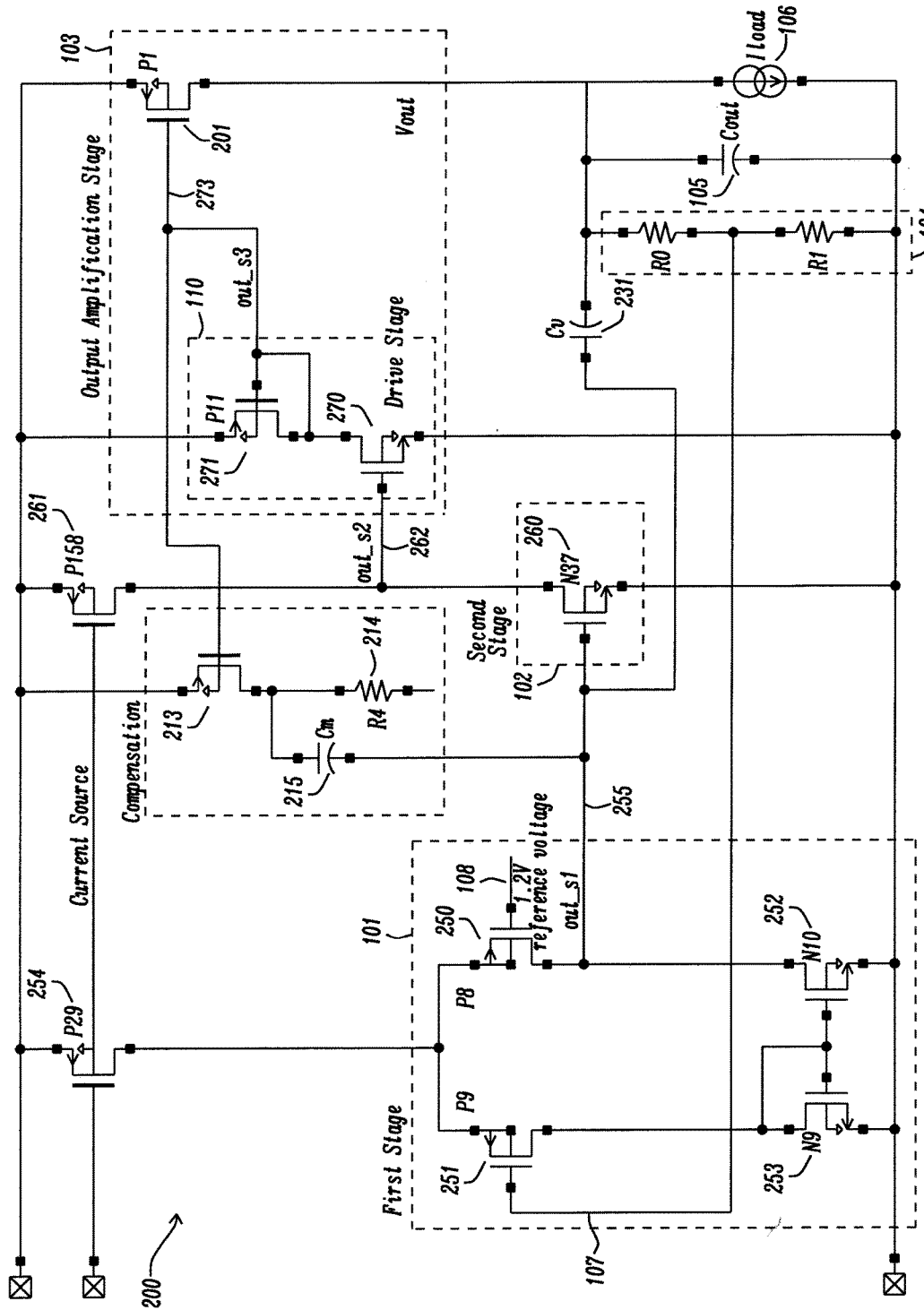
FIG. 2 shows an example circuit arrangement of an LDO regulator.

FIG. 2 illustrates an example circuit arrangement of an LDO regulator 200 comprising a Miller compensation using a capacitance $C_V$ 231 and a load current dependent compensation comprising a current mirror with transistors 201 (corresponding to the pass transistor 201) and 213, a compensation resistor 214 and a compensation capacitance $C_m$ 215.

The circuit implementation of FIG. 2 can be mapped to the block diagrams in FIGS. 1a and 1b, as similar components have received the same reference numerals. In the circuit arrangement 200, the differential amplification stage 101, the intermediate amplification stage 102 and the output amplification stage 103 are implemented using field effect transistors (FET), e.g. metal oxide semiconductor FETs (MOSFETs).

The differential amplification stage 101 comprises the differential input pair of transistors P9 251 and P8 250, and the current mirror N9 253 and N10 252. The input of the differential pair is e.g. a 1.2V reference voltage 108 at P8 and the feedback 107 at P9 which is derived from the resistive divider 104 (with e.g. R0=0.8 MΩ and R1=1.2 MΩ).

The intermediate amplification stage 102 comprises a transistor N37 260 (referred to herein as an input transistor), wherein the gate of transistor N37 260 is coupled to the stage output node 255 of the differential amplification stage 101 (also referred to as an input node of the intermediate amplification stage 102). The transistor P158 261 acts as a current source for the intermediate amplification stage 102, similar to transistor P29 254 which acts as a current source for the differential amplification stage 101.

The output amplification stage 103 is coupled to the stage output node 262 of the intermediate amplification stage 102 and comprises a pass device or pass transistor 201 (also referred to as an output transistor) and a gate driver stage 110 for the pass device 201, wherein the gate driver stage comprises a transistor 270 (also referred to as a control transistor) and a transistor P11 271 connected as a diode (also referred to as a diode transistor or as a transistor diode). This gate driver stage has essentially no gain since it is low-ohmic through the transistor diode P11 271 which yields a resistance of $1/g_m$ (output resistance of the driver stage 110 of the output amplification stage 103) to signal ground. The gate of the pass transistor 201 is identified in FIG. 2 with reference numeral 273.

In the present document, means for stabilizing the output voltage of a multi-stage amplifier such as the regulator 200 are described. These means may be used in conjunction with other stabilizing means, such as an output capacitor 105, Miller compensation 231 and/or load current dependent compensation 213, 214, 215. The described stabilizing means are configured to increase the stability of the multi-stage amplifier 200 subject to load transients, and at the same time to allow for a fast convergence of the multi-stage amplifier 200 subject to such load transients. Furthermore, the described stabilizing means allow for the implementation of a power efficient multi-stage amplifier 200.

In particular, the described means allow for a combined AB operation of the multi-stage amplifier 200, i.e. the described means provide a multi-state amplifier 200 which is configured to operate in a stable manner for positive load transients (when the load 106 increases) and for negative load transients (when the load 106 decreases). Even more particularly, an output stage of a multi-stage amplifier 200 is described which is configured to rapidly source current (for a positive load transient) and to rapidly sink current (for a negative load transient).

The multi-stage amplifier 200 may comprise a push-pull output stage which is working in so-called AB or B operation. The push-pull output stage may provide a linear (Class-AB) or slightly nonlinear (Class-B) output transfer function and may provide a drive capability on varying loads 106 and/or input or reference signals 108.

Figure 3:
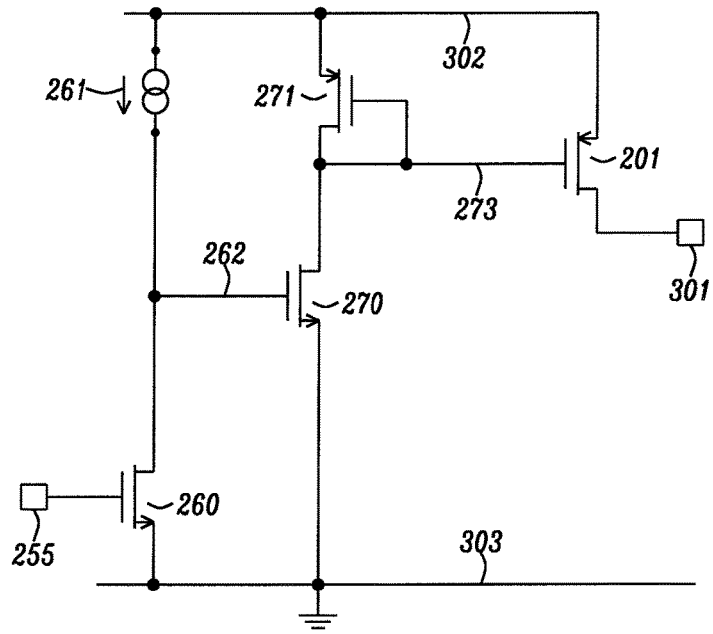
FIG. 3 shows an excerpt of the LDO regulator of FIG. 2.

The use of a push-pull output stage (comprising a first output stage which is coupled to the supply voltage and a second output stage which is coupled to ground) in conjunction with a multi-stage amplifier 200 such as an LDO may be difficult, due to relatively large gains of the multi-stage amplifier 200 and due to relatively high current ratios (~100) which are to-be-provided by the output stage. In this context, the intermediate stage and the output stage of an example multi-stage amplifier 200 are illustrated in FIG. 3. Possible mismatches of the bias control are typically translated into substantial currents in the output transistor 201 and may therefore lead to an increase of the power consumption of the multi-stage amplifier 200.

An example push-pull output stage may comprise an additional differential pair which forms a comparator or a linear amplifier and which is driving a sink device arranged in parallel to the multi-stage amplifier 200. The additional sink device may be used to sink a current from the output node 301 of the multi-state amplifier, when the differential pair is enabled by an overvoltage situation (subject to a negative transient). The use of an additional differential pair may lead to an increased mismatch and to an increase of a dead band between the A operation (for positive load transients) and the B operation (for negative load transients). Furthermore, the sink/source capability tends to be asymmetric and output voltage-dependent.

Figure 4:
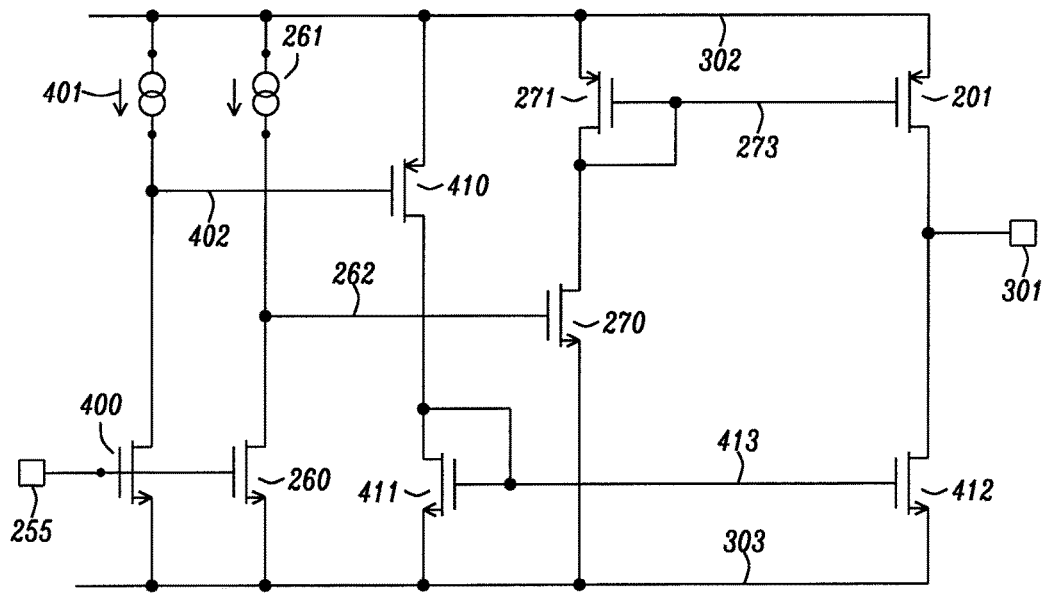
FIG. 4 shows an excerpt of an example LDO regulator comprising means for combined AB operation.

Alternatively, a complementary output stage may be used. FIG. 4 illustrates the intermediate stage and the push-pull output stage of a multi-stage amplifier 200. The multi-stage amplifier 200 comprises a first output stage 270, 271, 201 which is configured to source current to the output node 301. Furthermore, the multi-stage amplifier 200 comprises a second output stage 410, 411, 412 which is configured to sink current at the output node 301. The first output stage and the second output stage may be arranged in parallel with respect to one another. The second output stage may be designed in a complimentary manner with respect to the first output stage. In particular, the first output stage may comprise a current mirror with PMOS transistors and the second output stage may comprise a current mirror with NMOS transistors.

The first output stage 270, 271, 201 is controlled using a first intermediate stage 260, 261 (also referred to as a first intermediate amplification stage or as a first amplification stage), and the second output stage 410, 411, 412 is controlled using a second intermediate stage 400, 401 (also referred to as a second intermediate amplification stage or as a second amplification stage). The first intermediate stage and the second intermediate stage may have different operating points. The different operating points typically ensure that the first output stage and the second output stage do not operate concurrently.

By way of example, a second current source 401 of the second intermediate stage may provide a second current which is different from a first current provided by the first current source 261 of the first intermediate stage. As a result of this, the first midpoint 262 (between the first current source 401 and the first input transistor 400) of the first intermediate stage may be driven differently from the second midpoint 402 (between the second current source 261 and the second input transistor 260) of the second intermediate stage. Alternatively or in addition, the first input transistor 400 and the second input transistor 260 may have different sizes.

Subject to a positive load transient, the output voltage at the output node 301 drops causing an undervoltage situation. The output voltage is fed back to the input of the multi-stage amplifier 200 and leads to a drop of the input voltage at the input node 255. As a result of this, the gate 262 of the first control transistor 270 is driven high, thereby increasing the current through the first control transistor 270 (also referred to as the first control current). The increased current is mirrored to the first pass device 201 (also referred to as the first output transistor) using the first current mirror 271, 201 of the first output stage. Hence, the first output stage sources current to the output node 301 in an undervoltage situation.

At the same time, the second midpoint 402 (i.e. the gate of the second control transistor 410) is driven high, thereby closing the second control transistor 410 such that no current (also referred to as the second control current) is flowing through the second output transistor 412 of the second output stage. Hence, the second output stage does not sink current during an undervoltage situation.

Subject to a negative load transient, the output voltage at the output node 301 increases, thereby causing an overvoltage situation. The output voltage is fed back to the input of the multi-stage amplifier 200 and leads to an increase of the input voltage at the input node 255. As a result of this, the gate 402 of the second control transistor 410 is driven low, thereby increasing the current through the second control transistor 410. The increased current is mirrored to the second output transistor 412 using the second current mirror 411, 412 of the second output stage. Hence, the second output stage sinks current in an overvoltage situation.

Furthermore, the first midpoint 262 (i.e. the gate of the first control transistor 270) is driven low, thereby closing the first control transistor 270 such that no current is flowing through the first output transistor 201 of the first output stage. Hence, the first output stage does not source current during an overvoltage situation.

In other words, instead of adding Class B functionality into the output stage, a second intermediate stage is added to the first intermediate stage. Furthermore, a second (e.g. an Ndrive) output stage is added to provide sink currents at the output node 301. The transistors of the first output stage and of the second output stage may be coupled to the same supply voltage 302 (also referred to more generally as a high potential) and to the same ground potential 303 (also referred to more generally as a low potential, wherein the low potential is lower than the high potential). It should be noted however, that the transistors of the first output stage and of the second output stage may be coupled or connected to different supply voltages (i.e. to different high potentials).

Robust operation may be ensured by setting different operating points for the first output stage and for the second output stage. For this purpose, the second input transistor 400 may be designed to be smaller than the first input transistor 260. The operation of the first output stage may be regarded as "normal" (source mode) operation. Alternatively or in addition, the current ratio of the first current provided by the first current source 261 and the second current provided by the second current source 401 may be changed. In normal operation (in an undervoltage situation), the gate 262 of the first control transistor 270 may be in the range of ~0.5V and the current through the first input transistor 260 may be equal to the first current.

When the output node 301 is on overvoltage, the input node 255 is pulled high by preceding gain stages of the multi-stage amplifier 200 in order to stop the provision of current from the first output transistor 201. For this purpose, the gate 262 of the first control transistor 270 is pulled towards zero. If the input voltage at the input node 255 is sufficiently high to pull down the—previously disabled—gate 402 of the second control transistor 410, a current through the diode transistor 411 of the second current mirror is enabled. As a result of this, a sink current through the second output transistor 412 is enabled.

The appropriate design of the input transistors 260, 400 and of the current sources 261, 401 ensures that at any time only one of the two output stages is enabled. This operation mode may be referred to as a Class-B mode of operation, which exhibits a certain dead band in which both output stages are turned off. The width of the dead band may be substantially reduced by preceding gain stages of the multi-stage amplifier 200 (which are not shown in FIG. 4) which control the voltage feedback 107.

The provision of a dead band may lead to a reduced reaction speed of the multi-stage amplifier or regulator 200. In view of this, circuitry is described herein which enables one or more of the transistors of the regulator 200 to be held selectively active or in standby, even when the one or more transistors are to be turned off by the regulation, in order to allow for a fast reaction. Furthermore, a complementary output stage is described, which is implemented in a linear fashion. In addition, a control circuit for avoiding overlapping operation is described.

Overall, an LDO regulator 200 is provided which is able to source and sink a current while maintaining a defined output voltage. Furthermore, predetermined voltage up and down ramping (DVC) requirements may be fulfilled. The load step behavior of the output voltage from e.g. a negative output current to a positive output current may be improved by controlling the operating points of one or more selected transistors of the regulator 200. In addition, leakage currents may be compensated by regulation. Furthermore, no forward predictive current consumption is required.

Figure 5:
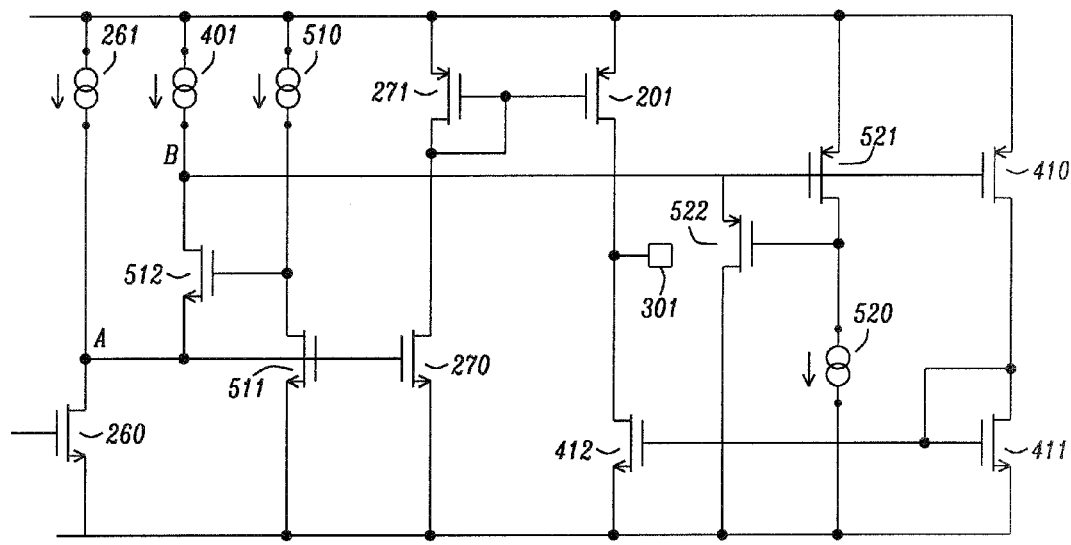
FIG. 5 shows an excerpt of an example regulator comprising an operating point control circuit.

FIG. 5 shows an excerpt of a regulator 200 which comprises circuitry that provides a minimum current control of the first output stage and of the second output stage and which keeps the intermediate gain stage comprising the input transistor 260 always active. As a result of this, the reaction speed to load transients may be increased.

The first output stage 270, 271, 201 may deliver a positive current to the output node 301 into a load of the regulator 200. In such a case, the intermediate amplification stage and in particular the input transistor 260 is active at the first gain node A. The regulator 200 comprises a first operating point control circuit 511, 510 and a second operating point control circuit 520, 521. The operating point control circuits may be configured to control the operating points of a output stage, when the respective other output stage is sourcing/sinking current to the output node 301.

The first operating point control circuit comprises a first reference current source 510 which is configured to provide a first reference current IminN. In a situation, where the first output stage sources current to the output node 301, the transistor 511 exhibits a scaled current which may be designed to be larger than the first reference current IminN. As a result of this, the clamp transistor 512 (also referred to herein as the second transistor) is turned off and hence the second gain node B is disconnected from the first gain node A. In such a situation, the second gain node B is clamped by the clamp transistor 522 of the second operating point control circuit. The clamp transistor 522, the second reference transistor 521 and the second reference current source 520, which provided a second reference current IminP, may then define the operating point of second gain node B so that there is a defined current (referred to herein as the second maintenance current) out of the second output stage.

The load of the regulator 200 may become negative. As a result of this, the current within the first output stage is reduced and the current in the second output stage is increased to keep the output voltage at the output node 301 stable. As a result of a negative load, the gate of the input transistor 260 is pulled up and the current through the input transistor 260 is increasing. Consequently, the first gain node A is pulled towards ground. When the current through the first reference transistor 511 falls below the first reference current IminN, the gate of the second transistor 512 is pulled up until the loop with the transistors 511, 512 is closed. As a result of this, the current through the first control transistor 270 of the first output stage is held nonzero, thereby maintaining a current (referred to herein as the first maintenance current) through first output stage.

As such, the first gain node A is clamped and the second gain node B becomes active and is pulled down by the input transistor 260. As a result of this, the current of second reference transistor 521 is increased and the clamp transistor 522 is turned off and a current which is larger than the second maintenance current is generated by the second output stage.

It should be noted that the first gain node A has a full supply swing (i.e. the range from the supply voltage 302 to ground 303, minus the threshold voltage of the input transistor 260) to generate an output current at the output node 301, while maintaining a second maintenance current in the second output transistor 412 of the second output stage. On the other hand, the second gain node B has a limited swing (i.e. the range from the supply voltage 302 to ground 303, minus the threshold voltage of the input transistor 260 and minus the threshold voltage of the second transistor 512) while maintaining the first output transistor 201 of the first output stage in conduction (at the first maintenance current). However, the second gain node B may be pulled lower, by zeroing the current in the first output transistor 201 of the first output stage. As such, the proposed operating point control circuits allow for substantially full supply swings.

Figure 6:
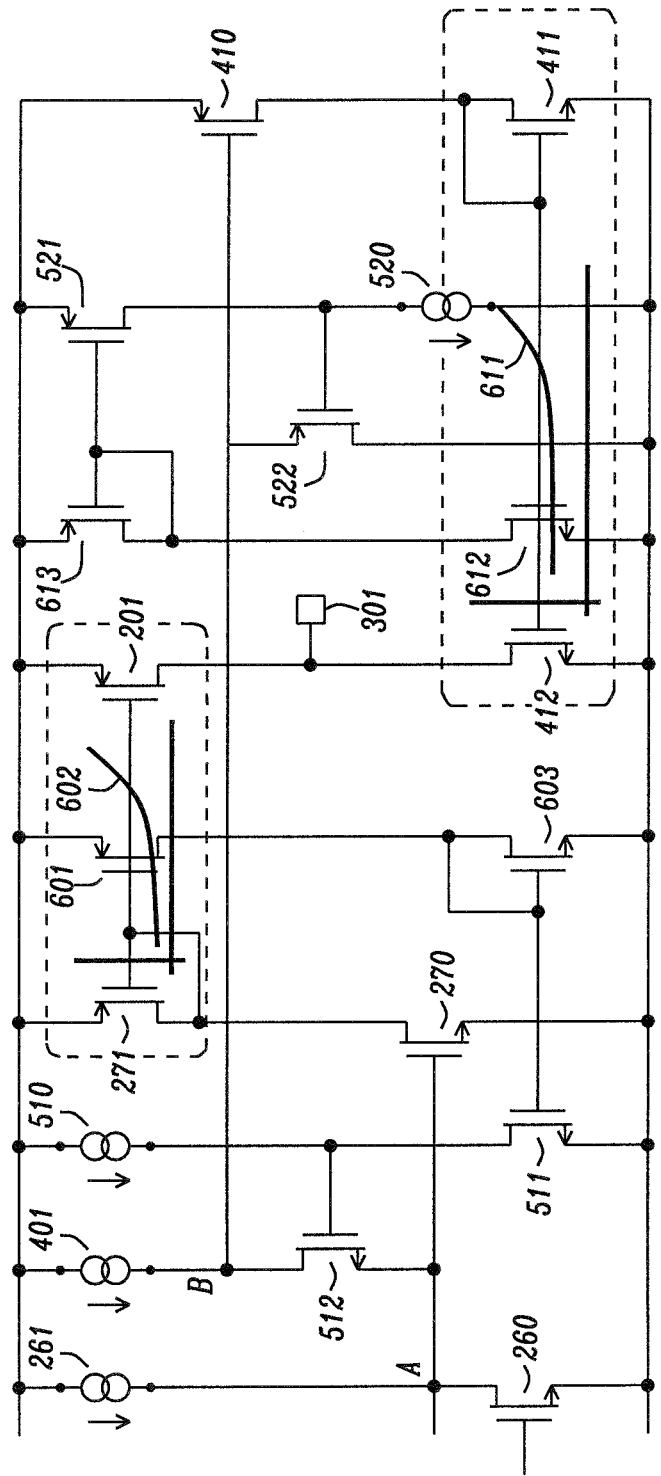
FIG. 6 shows an excerpt of an example regulator comprising an operating point control circuit with sense transistors.

The output stages may comprise nonlinear and/or buffered current mirrors (as illustrated by the nonlinear voltage/ current diagrams 602, 611 of FIG. 6). In particular, the current mirror 271, 201 of the first output stage and/or the current mirror 411, 412 of the second output stage may be nonlinear and/or buffered. In such a case, the operating point control circuits may be modified, in order to sense a scaled output current of the first and/or the second output stage (rather than to sense the drive current through the control transistors 270, 410 of the first and/or the second output stage).

FIG. 6 shows an excerpt of a regulator 200 with first and second operating point control circuits which are configured to sense the output currents of the first and the second output stage, respectively. In particular, the first operating point control circuit comprises a first sense transistor 601 which is configured to sense the first output current through the first output transistor 201 of the first output stage. This current is mirrored to the first reference transistor 511 using the transistor 603 which is arranged in series with the first sense transistor 601, and which forms a current mirror in conjunction with the first reference transistor 511). In a similar manner, the second operating point control circuit comprises a second sense transistor 612 which is configured to sense the second output current of the second output transistor 412 of the second output stage. This current is mirrored to the second reference transistor 521 using the transistor 613 which is arranged in series with the second sense transistor 612. As such, the scaled output currents are mirrored to the first and the second reference currents IminN and IminP, respectively.

Figure 7:
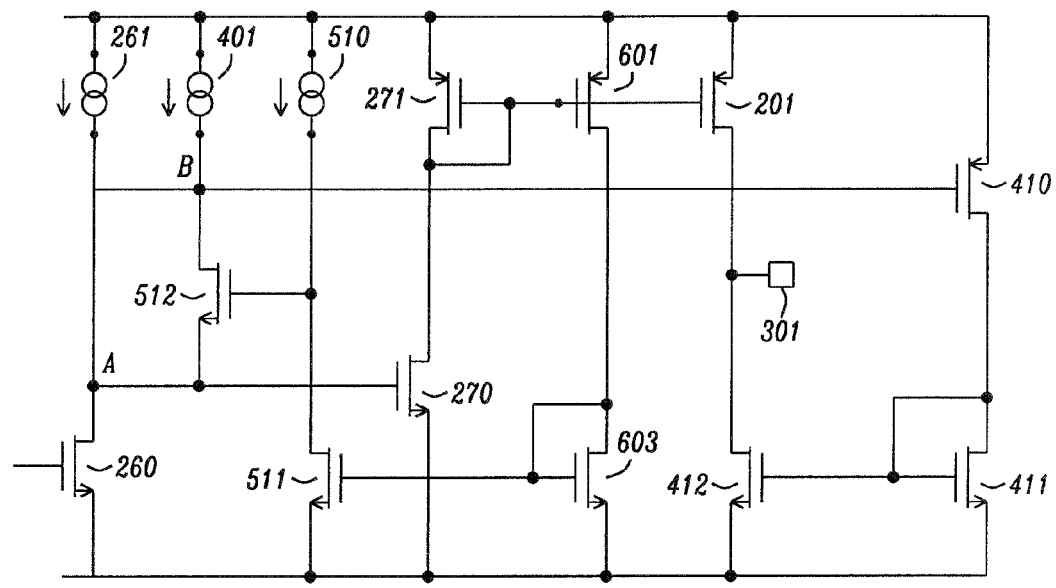
FIG. 7 shows an excerpt of an example regulator comprising a single side operating point control circuit.

FIG. 7 shows an excerpt of an LDO regulator 200 with a relatively large first output transistor 201 for the first output stage. The regulator comprises a first operating point control circuit for setting a first maintenance current through the first output transistor 201, in case of an active second output stage, i.e. in case of PMOS leakage or when sinking output currents larger than a current consumption. The first operating point control circuit maintains the transistors 260 and 270 enabled in order to maintain the first output stage in a standby mode. As a result of this, the step response of the output voltage during a transient load step from sinking mode into sourcing mode is improved.

Figure 8:
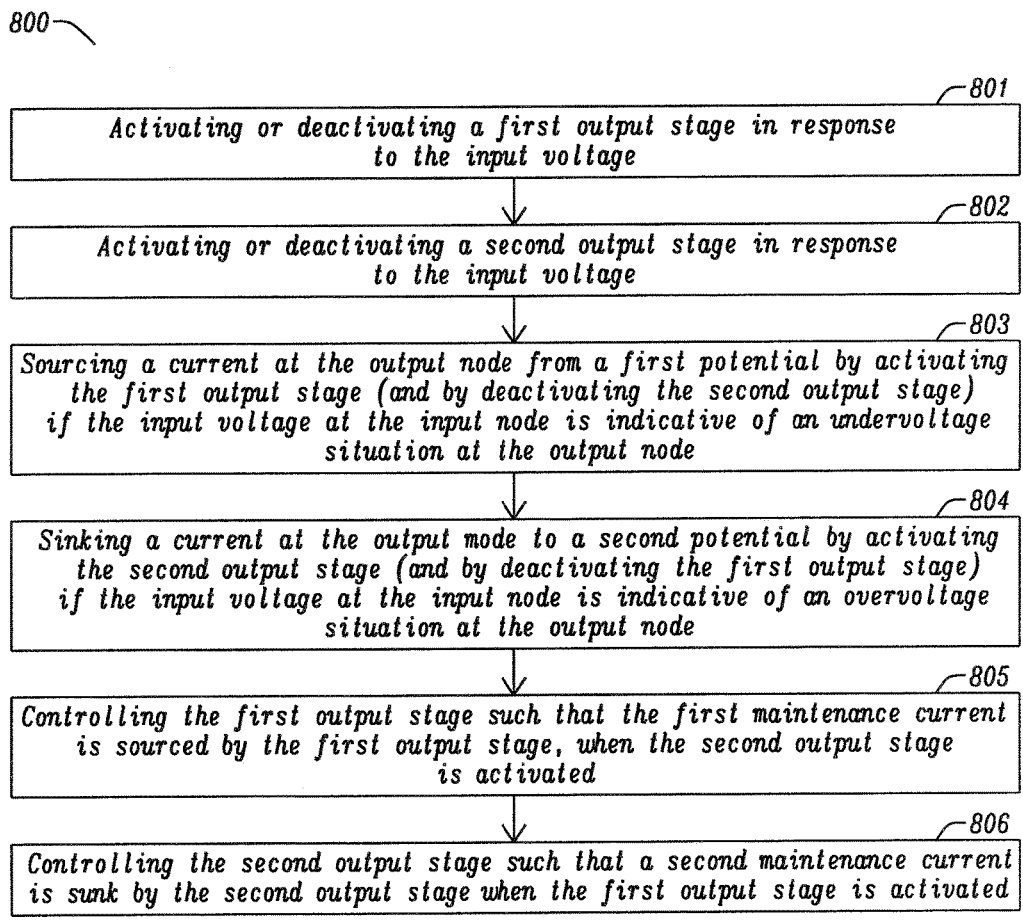
FIG. 8 shows a flow chart of an example method for controlling the output stage of a voltage regulator.

FIG. 8 shows a flow chart of an example method 800 for stabilizing an output voltage at an output node 301 of a voltage regulator 200. The method 800 comprises activating or deactivating 801 a first output stage 270, 271, 201 in response to an input voltage at an input node 255. For this purpose, an amplification stage 260, 261 may be used to control the voltage level at a first gain node A. The first output stage 270, 271, 201 may be activated or deactivated based on the voltage level at the first gain node A. Typically, the first output stage 270, 271, 201 is considered to be activated if the current, which is sourced at the output node 301 is greater than a first maintenance current (which may be used to maintain the first output stage 270, 271, 201 in a standby mode that allows for a fast re-activation of the first output stage 270, 271, 201). The input voltage at the input node 255 of the voltage regulator 200 is typically dependent on the output voltage at the output node 301.

The method 800 further comprises activating or deactivating 802 a second output stage 410, 411, 412 in response to the input voltage at the input node 255. For this purpose, the amplification stage 260, 261 may be used to control the voltage level at a second gain node B. The second output stage 410, 411, 412 may be activated or deactivated based on the voltage level at the second gain node B. Typically, the second output stage 410, 411, 412 is considered to be activated if the current, which is sunk at the output node 301 is greater than a second maintenance current (which may be used to maintain the second output stage 410, 411, 412 in a standby mode that allows for a fast re-activation of the second output stage 410, 411, 412).

The method 800 further comprises sourcing 803 a current at the output node 301 from a first potential 302, by activating the first output stage 270, 271, 201 (and by deactivating the second output stage 410, 411, 412), if the input voltage at the input node 255 is indicative of an undervoltage situation at the output node 301. Furthermore, the method 800 comprises sinking 804 a current at the output node 301 to a second potential 303, by activating the second output stage 410, 411, 412 (and by deactivating the first output stage 270, 271, 201), if the input voltage at the input node 255 is indicative of an overvoltage situation at the output node 301).

In addition, the method 800 may comprise controlling 805 the first output stage 270, 271, 201 such that the first maintenance current is sourced by the first output stage 270, 271, 201, when the second output stage 410, 411, 412 is activated. Alternatively or in addition, the method 800 may comprise controlling 806 the second output stage 410, 411, 412 such that a second maintenance current is sunk by the second output stage 410, 411, 412, when the first output stage 270, 271, 201 is activated.

In the present document, a robust AB control and sink/source output circuit has been described to enable fast transient responses even under negative loads. In the proposed circuit, the sink and source modes are separated by means of matching and/or operating point control. The internal gain stages may be held enabled and their operating points may be controlled to ensure fast reaction to load steps. Main loop stability measures such as the use of a Miller capacitor may be used for both modes of operation. The described circuits may be used to compensate leakage currents from a relatively larger PMOS output transistor 201 and/or from negative load currents, with minimal penalty in transient load voltage deviation.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:
1. A voltage regulator comprising
an amplification stage configured to control a voltage level of a first gain node and of a second gain node in response to an input voltage at an input node, in order to activate a first and a second output stage, respectively; wherein the second gain node is different from the first gain node;
the first output stage configured to source a current at an output node of the voltage regulator from a first potential, in dependence of the voltage level of the first gain node; wherein the first output stage is activated if the current which is sourced at the output node exceeds a pre-determined first maintenance current;
the second output stage configured to sink a current at the output node to a second potential, in dependence of the voltage level of the second gain node; wherein the first potential is different from the second potential; wherein the second output stage is activated if the current which is sunk at the output node exceeds a pre-determined second maintenance current; and a first operating point control circuit configured to set the voltage level of the first gain node such that the first maintenance current is sourced by the first output stage, when the second output stage is activated; and/or a second operating point control circuit configured to set the voltage level of the second gain node such that the second maintenance current is sunk by the second output stage, when the first output stage is activated, wherein the first output stage comprises
  a first control transistor having a gate which is coupled to the first gain node, and being configured to vary a first control current through the first control transistor, subject to a voltage level at the first gain node; and
  a first output amplifier configured to source an amplified version of the first control current to the output node; and/or the second output stage comprises
  a second control transistor having a gate which is coupled to the second gain node, and being configured to vary a second control current through the second control transistor, subject to a voltage level at the second gain node; and
  a second output amplifier configured to sink an amplified version of the second control current at the output node;

wherein the first output amplifier comprises a first current mirror with a first diode transistor and a first output transistor;

the first diode transistor is arranged in series with the first control transistor such that the first diode transistor is traversed by the first control current;

a drain of the first output transistor is coupled to the output node;

the first output transistor is traversed by the amplified version of the first control current, which is sourced at the output node;

the second output amplifier comprises a second current mirror with a second diode transistor and a second output transistor;

the second diode transistor is arranged in series with the second control transistor such that the second diode transistor is traversed by the second control current;

a drain of the second output transistor is coupled to the output node; and the second output transistor is traversed by the amplified version of the second control current, which is sunk at the output node.

2. The voltage regulator of claim 1, wherein the amplification stage is configured to activate the first output stage and the second output stage in a mutually exclusive manner.

3. The voltage regulator of claim 1, wherein the first output transistor and the second output transistor are arranged in series;

the output node corresponds to a midpoint between the first output transistor and the second output transistor;

a source of the first output transistor is coupled to the first potential;

a source of the second output transistor is coupled to the second potential;

a source of the first diode transistor is coupled to the first potential;

a source of the first control transistor is coupled to the second potential;

a source of the second diode transistor is coupled to the second potential; and a source of the second control transistor is coupled to the first potential.

4. The voltage regulator of claim 1, wherein the first control transistor comprises an N-type metaloxide semiconductor, referred to as MOS, transistor;

the first output amplifier comprises P-type MOS transistors;

the second control transistor comprises a P-type MOS transistor; and the second output amplifier comprises N-type MOS transistors.

5. The voltage regulator of claim 1, wherein the amplification stage comprises a first amplification stage current source configured to provide a first amplification stage current;

the amplification stage comprises an input transistor arranged in series with the first current source; wherein a gate of the input transistor is coupled to the input node;

the amplification stage is configured to control a voltage level at a midpoint between the first amplification stage current source and the input transistor, subject to the input voltage at the input node; and the midpoint between the first amplification stage current source and the input transistor corresponds to the first gain node.

6. The voltage regulator of claim 5, wherein the amplification stage comprises a second amplification stage current source configured to provide a second amplification stage current;

the amplification stage comprises a second transistor arranged in series with the second amplification stage current source; wherein the second transistor is controlled based on a feedback current through the first output stage; and a midpoint between the second current source and the second transistor corresponds to the second gain node.

7. The voltage regulator of claim 6, wherein the first amplification stage current source and the second amplification stage current source are coupled to the first potential;

the input transistor comprises a N-type MOS transistor;

a source of the input transistor is coupled to the second potential;

a drain of the input transistor is coupled to the first gain node;

the second transistor comprises a N-type MOS transistor;

a source of the second transistor is coupled to the first gain node; and a drain of the second transistor is coupled to the second gain node.

8. The voltage regulator of claim 7, wherein the second transistor is controlled based on a current sensed at the first control transistor; and/or a current sensed at an output of the first output amplifier.

9. The voltage regulator of claim 6, wherein the first operating point control circuit comprises a first reference current source configured to provide a first reference current;

the first operating point control circuit comprises a first reference transistor arranged in series with the first reference current source;

the first reference transistor is controlled based on the feedback current through the first output stage; and a midpoint between the first reference current source and the first reference transistor is coupled to a gate of the second transistor.

10. The voltage regulator of claim 9, wherein the first maintenance current is dependent on the first reference current.

11. The voltage regulator of claim 1, wherein the voltage regulator comprises a first sense transistor;

a source of the first sense transistor is coupled to a source of the first output transistor;

a gate of the first sense transistor is coupled to a gate of the first output transistor;

a current at a drain of the first sense transistor is used to control the second transistor.

12. The voltage regulator of claim 1, wherein the second operating point control circuit comprises a second reference current source configured to provide a second reference current;

the second operating point control circuit comprises a second reference transistor arranged in series with the second reference current source;

the second reference transistor is controlled based on a feedback current through the second output stage;

a midpoint between the second reference current source and the second reference transistor is coupled to a gate of a clamp transistor configured to set the level of the second gain node; and the second maintenance current is dependent on the second reference current.

13. A method for stabilizing an output voltage at an output node of a voltage regulator, the method comprising activating or deactivating a first output stage in response to an input voltage at an input node using an amplification stage; wherein the input voltage at the input node is dependent on the output voltage at the output node;

activating or deactivating a second output stage in response to the input voltage at the input node using the amplification stage;

sourcing a current at the output node from a first potential, by activating the first output stage, if the input voltage at the input node is indicative of an undervoltage situation at the output node;

sinking a current at the output node to a second potential, by activating the second output stage, if the input voltage at the input node is indicative of an overvoltage situation at the output node; and controlling the first output stage such that a first maintenance current is sourced by the first output stage, when the second output stage is activated; and/or controlling the second output stage such that a second maintenance current is sunk by the second output stage, when the first output stage is activated, wherein the first output stage comprises a first control transistor having a gate which is coupled to the first gain node, and to vary a first control current through the first control transistor, subject to a voltage level at the first gain node; and a first output amplifier to source an amplified version of the first control current to the output node; and/or the second output stage comprises a second control transistor having a gate which is coupled to the second gain node, and to vary a second control current through the second control transistor, subject to a voltage level at the second gain node; and a second output amplifier to sink an amplified version of the second control current at the output node;

wherein the first output amplifier comprises a first current mirror with a first diode transistor and a first output transistor;

the first diode transistor is arranged in series with the first control transistor such that the first diode transistor is traversed by the first control current;

a drain of the first output transistor is coupled to the output node;

the first output transistor is traversed by the amplified version of the first control current, which is sourced at the output node;

the second output amplifier comprises a second current mirror with a second diode transistor and a second output transistor;

the second diode transistor is arranged in series with the second control transistor such that the second diode transistor is traversed by the second control current;

a drain of the second output transistor is coupled to the output node; and the second output transistor is traversed by the amplified version of the second control current, which is sunk at the output node.

14. The method of claim 13, wherein the amplification stage activates the first output stage and the second output stage in a mutually exclusive manner.

15. The method of claim 13, wherein the first output transistor and the second output transistor are arranged in series;

the output node corresponds to a midpoint between the first output transistor and the second output transistor;

a source of the first output transistor is coupled to the first potential;

a source of the second output transistor is coupled to the second potential;

a source of the first diode transistor is coupled to the first potential;

a source of the first control transistor is coupled to the second potential;

a source of the second diode transistor is coupled to the second potential; and a source of the second control transistor is coupled to the first potential.

16. The method of claim 13, wherein the first control transistor comprises an N-type metaloxide semiconductor, referred to as MOS, transistor;

the first output amplifier comprises P-type MOS transistors;

the second control transistor comprises a P-type MOS transistor; and the second output amplifier comprises N-type MOS transistors.

17. The method of claim 13, wherein the amplification stage comprises a first amplification stage current source to provide a first amplification stage current;

the amplification stage comprises an input transistor arranged in series with the first current source; wherein a gate of the input transistor is coupled to the input node;

the amplification stage is to control a voltage level at a midpoint between the first amplification stage current source and the input transistor, subject to the input voltage at the input node; and the midpoint between the first amplification stage current source and the input transistor corresponds to the first gain node.

18. The method of claim 17, wherein
the amplification stage comprises a second amplification stage current source to provide a second amplification stage current;
the amplification stage comprises a second transistor arranged in series with the second amplification stage current source; wherein the second transistor is controlled based on a feedback current through the first output stage; and
a midpoint between the second current source and the second transistor corresponds to the second gain node.

19. The method of claim 18, wherein
the first amplification stage current source and the second amplification stage current source are coupled to the first potential;
the input transistor comprises a N-type MOS transistor;
a source of the input transistor is coupled to the second potential;
a drain of the input transistor is coupled to the first gain node;
the second transistor comprises a N-type MOS transistor;
a source of the second transistor is coupled to the first gain node; and
a drain of the second transistor is coupled to the second gain node.

20. The method of claim 19, wherein the second transistor is controlled based on
a current sensed at the first control transistor; and/or
a current sensed at an output of the first output amplifier.

21. The method of claim 18, wherein
the first operating point control circuit comprises a first reference current source to provide a first reference current;
the first operating point control circuit comprises a first reference transistor arranged in series with the first reference current source;
the first reference transistor is controlled based on the feedback current through the first output stage; and
a midpoint between the first reference current source and the first reference transistor is coupled to a gate of the second transistor.

22. The method of claim 21, wherein the first maintenance current is dependent on the first reference current.

23. The method of claim 13, wherein
the voltage regulator comprises a first sense transistor;
a source of the first sense transistor is coupled to a source of the first output transistor;
a gate of the first sense transistor is coupled to a gate of the first output transistor;
a current at a drain of the first sense transistor is used to control the second transistor.

24. The method of claim 13, wherein
the second operating point control circuit comprises a second reference current source to provide a second reference current;
the second operating point control circuit comprises a second reference transistor arranged in series with the second reference current source;
the second reference transistor is controlled based on a feedback current through the second output stage;
a midpoint between the second reference current source and the second reference transistor is coupled to a gate of a clamp transistor to set the level of the second gain node; and
the second maintenance current is dependent on the second reference current.

* * * * *